US008112167B2

(12) United States Patent
Endo et al.

(10) Patent No.: US 8,112,167 B2

(45) Date of Patent: Feb. 7, 2012

(54) PROCESS CONTROLLER FOR SEMICONDUCTOR MANUFACTURING, UTILIZING DANGEROUS PATTERN IDENTIFICATION AND PROCESS CAPABILITY DETERMINATION

(75) Inventors: Ayako Endo, Yokohama (JP); Kenji Yoshida, Oita (JP); Toshiya Kotani, Tokyo (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 591 days.

(21) Appl. No.: 12/354,574

(22) Filed: Jan. 15, 2009

(65) Prior Publication Data

US 2009/0192643 A1 Jul. 30, 2009

(30) Foreign Application Priority Data

Jan. 18, 2008 (JP) ................................ 2008-009218

(51) Int. Cl.
*G06F 19/00* (2006.01)
*G06F 17/50* (2006.01)

(52) U.S. Cl. ........................... 700/100; 700/121; 716/54

(58) Field of Classification Search .............. 700/28–32, 700/95–97, 99, 100, 103, 105, 117–121; 716/50–56, 100, 101, 106, 110–112, 118, 716/119, 138, 139; 703/13–16

See application file for complete search history.

(56) References Cited

U.S. PATENT DOCUMENTS

| | | | | |
|---|---|---|---|---|
| 6,647,536 | B2 * | 11/2003 | Bradley et al. | 716/55 |
| 7,213,226 | B2 * | 5/2007 | Kotani et | 716/53 |
| 7,269,470 | B2 | 9/2007 | Kouno et al. | |
| 7,434,198 | B2 * | 10/2008 | Strelkova et al. | 716/53 |
| 7,509,623 | B2 * | 3/2009 | Kobayasi et al. | 716/54 |
| 7,546,178 | B2 * | 6/2009 | Kouno et al. | 700/121 |
| 7,617,474 | B2 * | 11/2009 | Pang et al. | 716/139 |
| 7,695,876 | B2 * | 4/2010 | Ye et al. | 430/30 |
| 7,712,064 | B2 * | 5/2010 | Scheffer et al. | 716/119 |
| 7,752,595 | B2 * | 7/2010 | Maeda et al. | 716/52 |
| 7,945,871 | B2 * | 5/2011 | Cobb et al. | 716/52 |
| 2007/0061773 | A1 * | 3/2007 | Ye et al. | 716/21 |
| 2007/0101310 | A1 * | 5/2007 | Stirniman et al. | 716/21 |
| 2008/0148195 | A1 * | 6/2008 | Chan et al. | 716/2 |

FOREIGN PATENT DOCUMENTS

| | | |
|---|---|---|
| JP | 2004-030579 | 1/2004 |
| JP | 2004-079586 | 3/2004 |
| JP | 2007-057948 | 3/2007 |

* cited by examiner

*Primary Examiner* — M. N. Von Buhr

(74) *Attorney, Agent, or Firm* — Finnegan, Henderson, Farabow, Garrett & Dunner, L.L.P.

(57) ABSTRACT

A process control method comprises adjusting a process condition in consideration of a performance variation among a plurality of manufacturing apparatuses, the performance variation affecting a finished shape of a pattern used to manufacture a semiconductor device, running a simulation of the finished shape under the adjusted process condition, extracting a dangerous point of the pattern affecting satisfaction from the result of the simulation, comparing a first process capability serving as a judgment standard to find whether a production schedule of the device is achieved with a second capability serving to form a dangerous pattern containing the dangerous point, and improving the second process when the second process capability is lower than the first process capability.

15 Claims, 4 Drawing Sheets

START
CALCULATE, FROM PRODUCTION SCHEDULE OF SEMICONDUCTOR DEVICE X, NUMBER OF CHIPS TO BE PRODUCED ~S1
ACQUIRE LAYOUT DATA FOR SEMICONDUCTOR DEVICE X ~S4
DECIDE NUMBER OR LOTS TO BE INPUT ~S2
DECIDE PROCESS CONDITION ~S5
DECIDE MANUFACTURING APPARATUSES TO BE USED, AND NUMBER OF EACH MANUFACTURING APPARATUSE ~S3
ADJUST PROCESS CONDITION CONSIDERING PERFORMANCE VARIATION ~S6
SIMULATION ~S7
EXTRACT DANGEROUS POINTS ~S8
CALCULATE NUMBER, COORDINATES (LOCATIONS) AND SIZES OF DANGEROUS POINTS ~S9
SELECT DANGEROUS PATTERN Y ~S10
CALCULATE PORCESS CAPABILITY A OF DANGEROUS PATTERN Y ~S11
PROCESS CAPABILITY A≧PORCESS CAPABILITY B DESIRED IN PRODUCTION SCHEDULE? S12
YES
PRODUCTION ~S13
END
NO
ANALYZE AND IDENTIFY FACTOR CAUSING PROCESS CAPABILITY A TO BE EQUAL TO OR HIGHER THAN PROCESS CAPABILITY B ~S14
CHANGE PROCESS CONDITION S15
CHANGE LAYOUT DATA S16
REDUCE NUMBER OF APPARATUSES S17
NARROW CONTROL WIDTH OF PATTERN Y S18

PROCESS CONTROLLER FOR SEMICONDUCTOR MANUFACTURING, UTILIZING DANGEROUS PATTERN IDENTIFICATION AND PROCESS CAPABILITY DETERMINATION

CROSS REFERENCE TO RELATED APPLICATION

This application claims benefit of priority under 35 USC §119 to Japanese patent application No. 2008-009218, filed on Jan. 18, 2008, the contents of which are incorporated by reference herein.

BACKGROUND OF THE INVENTION

1. Field of the Invention

The present invention relates to a process controller, a process control method, and a computer-readable recording medium.

2. Related Background Art

Recent advances in semiconductor manufacturing technologies have been remarkable, and semiconductor devices sized at a minimum processing dimension of 65 nm are mass-produced. Such miniaturization is enabled by significant progresses in micropattern forming technologies such as a mask process technology, a photolithographic technology and an etching technology.

When the size of a pattern was great enough, a planar shape of an LSI pattern to be formed on a wafer was drawn as it is as a design pattern, a mask pattern faithful to the design pattern was created, the mask pattern was transferred onto the wafer by a projection optical system, and a foundation was etched, such that a pattern substantially conforming with the design pattern could be formed on the wafer.

However, it is becoming more and more difficult to improve mass production yield along with the advance in the miniaturization of patterns.

In order to improve the mass production yield, various methods have been employed. For example, technologies called optical proximity correction (OPC) and process proximity correction (PPC) are used to faithfully transfer a design pattern onto a wafer in a lithographic step. However, there are various design patterns. Even if patterns are subjected to the OPC or PPC, there are patterns (hereinafter referred to as "dangerous patterns") including parts (hereinafter referred to as "dangerous points") that may not satisfy a required specification due to a small lithography margin after transfer to the wafer. Identifying such a dangerous pattern after actually transferred onto the wafer is disadvantageous to the development of the mass production of semiconductor devices. Thus, it is important to previously take measures for dangerous patterns such as by running a lithography simulation on the basis of design data to find the dangerous patterns at the stage of development. To this end, various methods have been proposed (e.g., Japanese laid open (kokai) 2004-030579 and Japanese laid open (kokai) 2007-057948).

However, the methods according to the prior arts do not take into account the fact that there are a plurality of semiconductor manufacturing apparatuses for mass production development at the time of the extraction of dangerous patterns. Design data and a process condition set for semiconductor devices to be produced do not necessarily precisely conform to the semiconductor manufacturing apparatuses used in production. It is even more obvious that a deviation from a set process condition is greater in the whole production line when there are a plurality of manufacturing apparatuses used.

Thus, the prior arts disadvantageously lack robustness against the deviation from the process condition in the production of semiconductor devices.

SUMMARY OF THE INVENTION

According to a first aspect of the present invention, there is provided a process controller comprising:

a manufacturing apparatus deciding unit which decides the number of lots to be input to a production line on the basis of a production schedule of a semiconductor device targeted for manufacture, calculates a first process capability serving as a judgment standard to find whether the production schedule is achieved, decides a plurality of manufacturing apparatuses used to manufacture the semiconductor device, and calculates the number of the decided manufacturing apparatuses from the number of input lots;

a process condition deciding/adjusting unit which prescribes a process condition of the manufacturing apparatuses from a design layout of the semiconductor device, and adjusts the process condition in consideration of a performance variation among the plurality of manufacturing apparatuses, the performance variation affecting a finished shape of a pattern used to manufacture the semiconductor device;

a simulator which runs a simulation of the finished shape under the adjusted process condition;

a dangerous pattern identifying unit which extracts a dangerous point affecting satisfaction of a required specification from the result of the simulation, and prescribes a pattern containing the extracted dangerous point as a dangerous pattern;

a process capability calculating/adjusting unit which calculates a second process capability different from the first process capability, the second process capability serving to form the prescribed dangerous pattern in the production line as a pattern having the desired shape, and compares the calculated second process capability with the first process capability, the process capability calculating/adjusting unit providing the calculated number of manufacturing apparatuses with a command to produce the semiconductor device under the adjusted process condition when the second process capability is equal to or higher than the first process capability; and a process capability improving unit which improves the second process capability when the calculated second process capability is lower than the first process capability.

According to a second aspect of the present invention, there is provided a process control method comprising:

deciding the number of lots to be input to a production line on the basis of a production schedule of a semiconductor device targeted for manufacture;

calculating a first process capability serving as a judgment standard to find whether the production schedule is achieved;

deciding a plurality of manufacturing apparatuses used to manufacture the semiconductor device, and calculating the number of the decided manufacturing apparatuses from the number of input lots;

prescribing a process condition of the manufacturing apparatuses from a design layout of the semiconductor device;

adjusting the process condition in consideration of a performance variation among the plurality of manufacturing apparatuses, the performance variation affecting a finished shape of a pattern used to manufacture the semiconductor device;

running a simulation of the finished shape under the adjusted process condition;

extracting a dangerous point affecting satisfaction of a required specification from the result of the simulation;

prescribing a pattern containing the extracted dangerous point as a dangerous pattern;

calculating a second process capability serving to form the prescribed dangerous pattern in the production line as a pattern having the desired shape;

comparing the calculated second process capability with the first process capability;

using the calculated number of manufacturing apparatuses to produce the semiconductor device under the adjusted process condition when the second process capability is equal to or higher than the first process capability; and improving the second process capability when the second process capability is lower than the first process capability.

According to a third aspect of the present invention, there is provided a computer—readable recording medium containing a program to execute a computer a process control method, the process control method comprising:

deciding the number of lots to be input to a production line on the basis of a production schedule of a semiconductor device targeted for manufacture;

calculating a first process capability serving as a judgment standard to find whether the production schedule is achieved;

deciding a plurality of manufacturing apparatuses used to manufacture the semiconductor device, and calculating the number of the decided manufacturing apparatuses from the number of input lots;

calculating a second process capability serving to form a dangerous pattern in the production line as a pattern having the desired shape, the dangerous pattern containing a dangerous point that affects satisfaction of a required specification and is extracted from a finished shape obtained through a simulation from a design layout of the semiconductor device under a process condition that is adjusted in consideration of a performance variation among the plurality of manufacturing apparatuses.

DETAILED DESCRIPTION OF THE INVENTION

Hereinafter, some embodiments of the present invention will be described with reference to the drawings. A semiconductor device targeted for manufacture is mentioned below as a semiconductor device X.

(1) Process Controller

Figure 1:
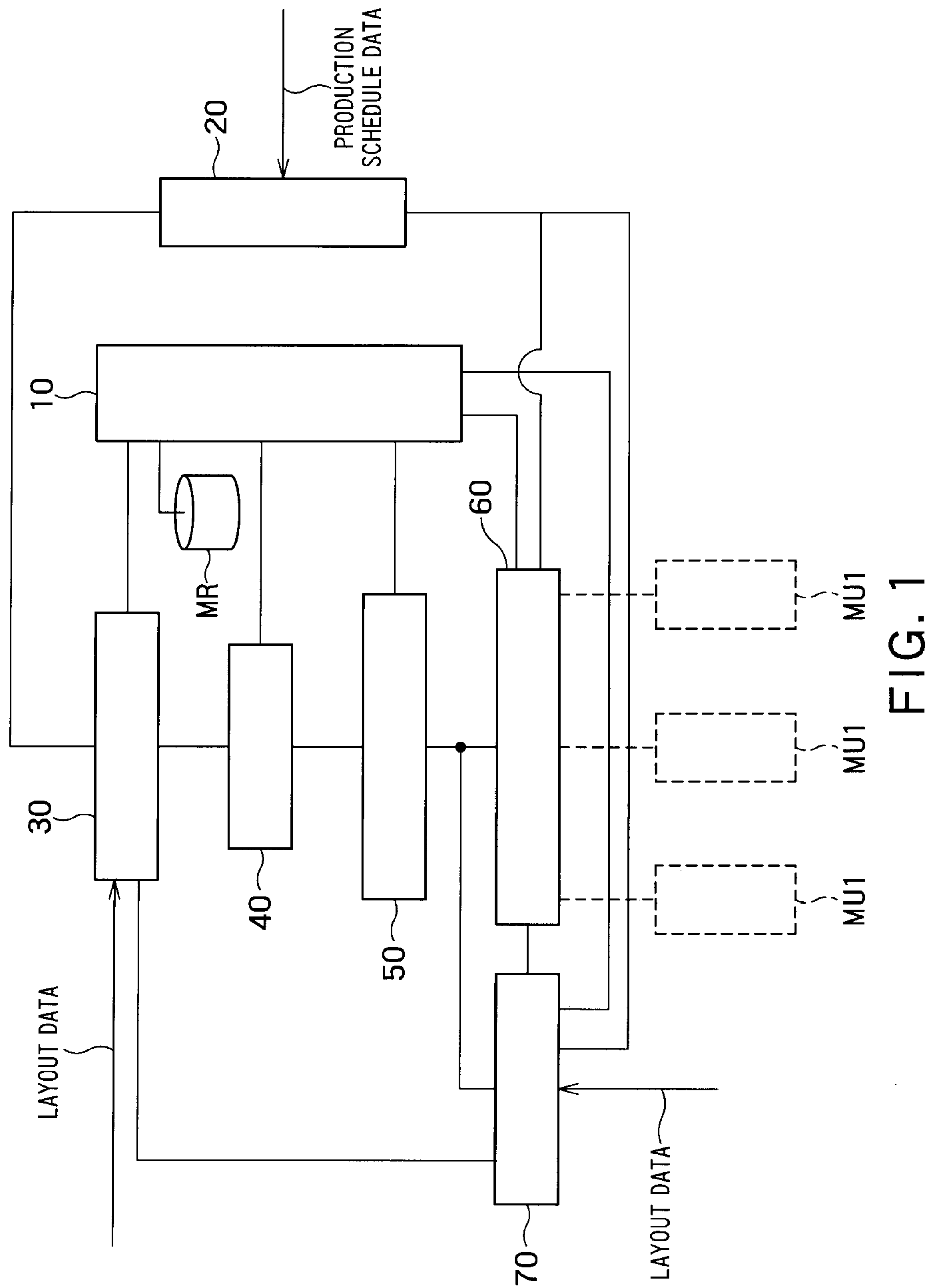
FIG. 1 is a block diagram showing the schematic configuration of one embodiment of a process controller according to the present invention.

FIG. 1 is a block diagram showing the schematic configuration of one embodiment of a process controller according to the present invention.

The process controller shown in FIG. 1 comprises a control computer 10, a manufacturing apparatus deciding unit 20, a process condition deciding/adjusting unit 30, a simulator 40, a dangerous pattern identifying unit 50, a process capability calculating/judging unit 60 and a process capability improving unit 70.

The control computer 10 is connected not only to a memory MR but also to all the other components of the process controller shown in FIG. 1. The control computer 10 reads a recipe file which is stored in the memory MR and in which the specific processing procedure of a later-mentioned process control method is described. The control computer 10 generates a command signal in accordance with this recipe file and provides the command signal to other components.

The manufacturing apparatus deciding unit 20 is connected to the process condition deciding/adjusting unit 30 and the process capability improving unit 70. Production schedule data for the device X is input to the manufacturing apparatus deciding unit 20 via an unshown I/O. The manufacturing apparatus deciding unit 20 calculates the number of chips to be produced and the number of lots to be input.

The manufacturing apparatus deciding unit 20 also decides the kinds of manufacturing apparatuses used to manufacture the device X and the number of manufacturing apparatuses of each kind, and supplies information on each manufacturing apparatus together with information on a performance variation among the apparatuses to the process condition deciding/adjusting unit 30 and the process capability improving unit 70. Further, the manufacturing apparatus deciding unit 20 calculates a process capability B desired in a production schedule and supplies the process capability B to the process capability calculating/judging unit 60. In the present embodiment, the process capability B desired in the production schedule corresponds to, for example, a first process capability.

Layout data (design data) for the device X is input to the process condition deciding/adjusting unit 30 via an unshown I/O. The process condition deciding/adjusting unit 30 decides a process condition of each manufacturing apparatus, and also adjusts the process condition in consideration of the performance variation among the manufacturing apparatuses.

The simulator 40 is connected to the process condition deciding/adjusting unit 30 and the dangerous pattern identifying unit 50. The simulator 40 runs a simulation of a finished shape by use of the layout data for the device X under the process condition provided from the process condition deciding/adjusting unit 30, and thus extracts dangerous points. The simulator 40 provides data on the dangerous points to the dangerous pattern identifying unit 50.

The dangerous pattern identifying unit 50 is connected to the process capability calculating/judging unit 60. The dangerous pattern identifying unit 50 processes the data on the extracted dangerous points, and thereby selects a dangerous pattern Y expected to affect a manufacturing process, and then provides data on the dangerous pattern Y to the process capability calculating/judging unit 60.

The process capability calculating/judging unit 60 is connected not only to the manufacturing apparatus deciding unit 20 and the process capability improving unit 70 but also to manufacturing apparatuses MU1 to MUN. The process capability calculating/judging unit 60 calculates a process capability A of the dangerous pattern Y in a current production line from the data on the dangerous pattern Y. A specific method of the calculation will be described later.

The process capability calculating/judging unit 60 further compares the calculated process capability A of the dangerous pattern Y with the process capability B desired in the production schedule supplied from the manufacturing apparatus deciding unit 20. When it is found as a result of the comparison that the process capability A is equal to or higher than the process capability B, there is no problem in terms of production. Thus, the process capability calculating/judging unit 60 generates a production command and supplies the production command to the manufacturing apparatuses MU1 to MUN so that the device X is manufactured.

On the other hand, when it is found as a result of the comparison that the process capability A is lower than the process capability B, the process capability calculating/judging unit 60 informs the process capability improving unit 70 of this comparison result.

In response to the information on the comparison result, the process capability improving unit 70 selects a measure to improve the process capability A after analysis of the comparison result, and generates a command signal for carrying out the selected measure, and then supplies the command signal to the associated components. A specific example of the measure to improve the process capability A will be described later.

(2) Process Control Method

Next, the process control method using the process controller shown in FIG. 1 is described below as embodiments of the process control method according to the present invention.

(i) First Embodiment

Figure 2:
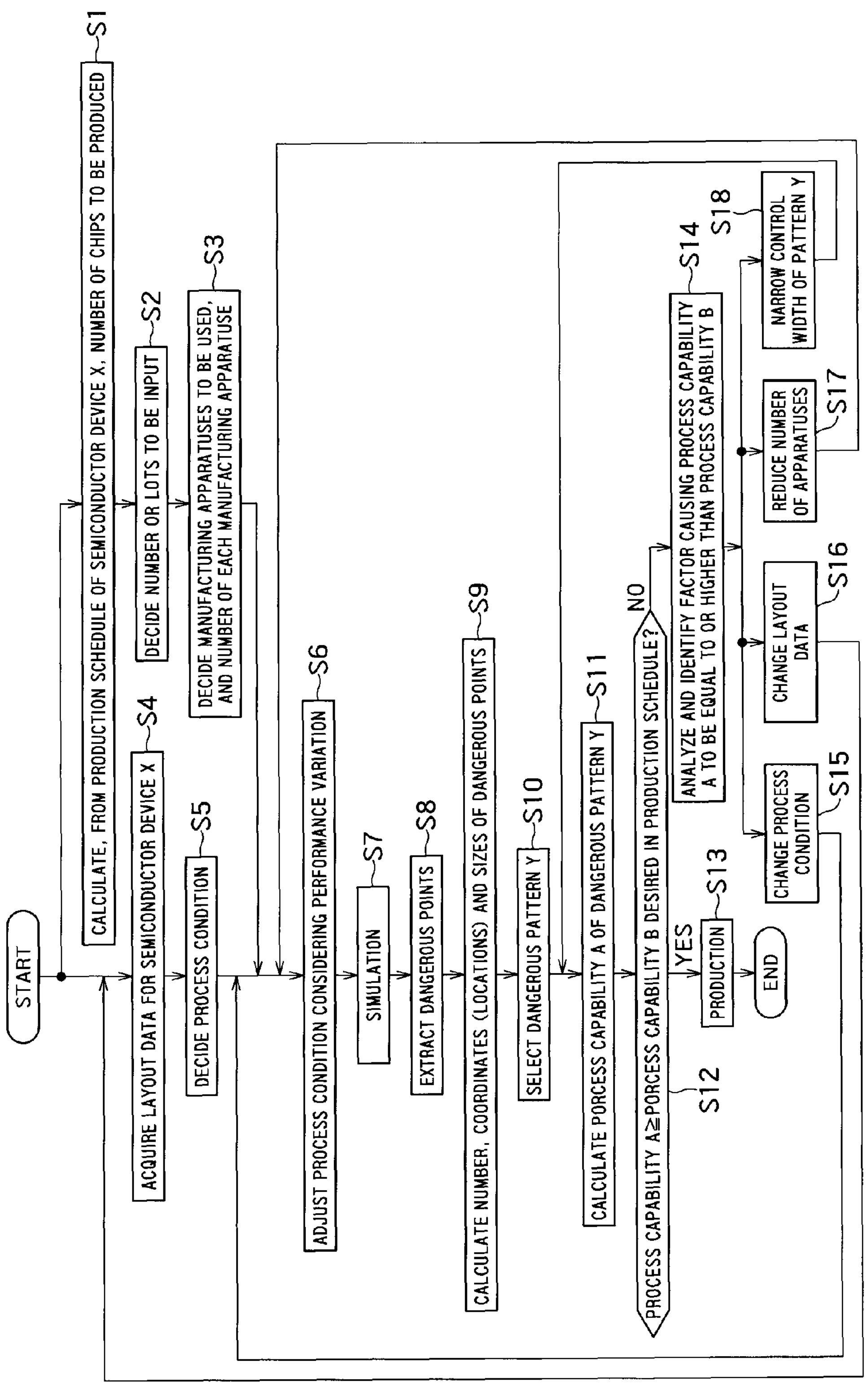
FIG. 2 is a flowchart showing the outline of a first embodiment of a process control method according to the present invention.

FIG. 2 is a flowchart showing the outline of a manufacturing process in a first embodiment of the process control method according to the present invention.

First, a production schedule for a semiconductor device X is input to the manufacturing apparatus deciding unit 20 via the unshown I/O, and the manufacturing apparatus deciding unit 20 calculates, from the production schedule, the number of chips to be produced (step S1). Then, the manufacturing apparatus deciding unit 20 calculates, from the calculated number of chips, the number of lots necessary for mass production, and thus decides the number of lots to be input to a production line (step S2). The manufacturing apparatus deciding unit 20 also calculates the process capability B desired in the production schedule, and provides the result of the calculation to the process capability calculating/judging unit 60. A method of calculating the process capability will be described later in detail.

Then, the manufacturing apparatus deciding unit 20 decides, from the decided number of lots, the kinds of manufacturing apparatuses necessary to manufacture the semiconductor device X and the number of manufacturing apparatuses of each kind, and provides such information to the process condition deciding/adjusting unit 30 together with information on a performance variation among the apparatuses (step S3). While the manufacturing apparatuses used for the mass production of semiconductors include various kinds of process apparatuses, exposure apparatuses are taken as an example in the subsequent steps for the simplification of explanation. Manufacturing of arbitrary one of a larger number of layers constituting the semiconductor device X is described.

Then, the process condition deciding/adjusting unit 30 acquires the layout data (design data) for the above-mentioned layer of the device X via the unshown I/O (step S4), and loads information on the exposure apparatuses decided by the manufacturing apparatus deciding unit 20 in step S3 to decide a process condition (step S5). The process condition is decided experimentally or by use of a simulation in consideration of, for example, the minimum line width of the semiconductor device X and the wafer foundation structure of the above-mentioned layer.

The process condition deciding/adjusting unit 30 further adjusts the process condition taking into consideration the performance variation among the manufacturing apparatuses in accordance with the kinds of manufacturing apparatuses and the number of manufacturing apparatuses of each kind that have been decided in step S3 (step S6). The process condition deciding/adjusting unit 30 provides the adjusted process condition to the simulator 40.

Here, the performance variation among the manufacturing apparatuses corresponds to a variation among what is called adjustment parameters when an explanation is made for, e.g., the exposure apparatuses. The adjustment parameter of the exposure apparatus specifically includes at least one of an illumination shape, NA (lens numerical aperture), aberration, a polarization degree, chromatic aberration, illumination luminance distribution, an exposure amount, a focus value, the amount of flare attributed to the apparatus, and the amount of deterioration in synchronization accuracy during a scan.

The specification of the exposure apparatus used in production adapts to the semiconductor manufacture at the delivery to a factory. However, when there are a plurality of exposure apparatuses, the performances of the apparatuses do not completely coincide with each other and vary in specifications. The performance variation of the exposure apparatuses can affect a variation in the performance of the semiconductor device X.

Thus, in the present embodiment, the process condition deciding/adjusting unit 30 adjusts the process condition in such a manner as to take in the variation of adjustment parameters among the exposure apparatuses to be used (step S6), and provides data on the adjusted process condition to the simulator 40 and the process capability improving unit 70. For example, when the semiconductor device X is manufactured by use of exposure apparatuses A and B, an exposure amount condition (process condition) is prescribed as an exposure amount having a fixed margin including one of an exposure amount range a and an exposure amount range b, where the exposure amount range a is the range of an exposure amount including a variation in the set amount of exposure of the exposure apparatus A, and the exposure amount range b is the range of an exposure amount including a variation in the set amount of exposure of the exposure apparatus B. That is, the exposure amount is prescribed so that the variation in the exposure amounts of a plurality of exposure apparatuses may be included. Moreover, not only one adjustment parameter is adjusted but also a plurality of adjustment parameters of the plurality of apparatuses mentioned above are adjusted.

Then, the simulator 40 runs a simulation of a finished shape by use of the above-mentioned layout data under the adjusted process condition (step S7), and extracts dangerous points (generally called errors) (step S8), and then provides data on the dangerous points to the dangerous pattern identifying unit 50. For the extraction of the dangerous points, it is possible to employ a simulation using a process condition having a fixed margin such as a lithography simulation, more specifically, the above-mentioned methods disclosed in Japanese laid open (kokai) 2004-030579 and Japanese laid open (kokai) 2004-079586, the contents of which are incorporated herein by reference.

As described above, according to the present embodiment, the process condition is adjusted in consideration of the performance variation among the exposure apparatuses which is calculated from the production schedule and which is derived from the plurality of exposure apparatuses used for production. Thus, it is possible to allow for a certain degree of margin in the range of the adjusted process condition as compared with the process condition once decided in the previous step.

Then, the dangerous pattern identifying unit 50 calculates the number, coordinates (locations) and sizes (how much the margin does not reach the specification of mass production) of the extracted dangerous points (step S9). The dangerous pattern identifying unit 50 selects the dangerous pattern Y expected to most affect a manufacturing process such as a lithography process in the design data among the patterns containing the extracted dangerous points (step S10), and provides the dangerous pattern Y to the process capability calculating/judging unit 60 and the process capability improving unit 70. In the present embodiment, the pattern Y has the lowest lithography tolerance among design patterns. In addition, as the pattern Y, it is possible to select a pattern equal to or lower than predetermined process tolerance instead of the pattern having the lowest lithography tolerance.

Then, the process capability calculating/judging unit 60 calculates the process capability A of the dangerous pattern Y in the current production line identified in the group of manufacturing apparatuses decided in step S3 (step S11). Here, the method of calculating the process capability is described.

In the present embodiment, first, a specification is defined to be, for example, the kind, type, shape, dimension, structure, equipment, electric performance, quality, grade, components, performance, durability or safety level of a semiconductor. The specification includes a certain range for meeting standards. The upper limit of the specification is referred to as an upper specification limit (USL), and the lower limit of the specification is referred to as a lower specification limit (LSL).

Furthermore, the process capability means the capability to produce devices within the set specification range, and the index for evaluating this capability is the process capability (Cp) and is indicated by the following equation:

$$Cp=(\text{upper specification limit}-\text{lower specification limit})/6\sigma \quad \text{(Equation 1)}$$

Moreover, Cp does not consider the disproportion of the specification variations of devices to be produced. A process capability index Cpk considering this disproportion is expressed by the following equation:

$$Cpk=|\text{specification limit closer to average value}-\text{average value}|/3\sigma \quad \text{(Equation 2),}$$

where σ signifies a standard deviation, and is a numerical value representing how statistical values are dispersed. In the present embodiment, the dispersion of the statistical values indicates the performance variation of the devices, and the average value is a value obtained by dividing the sum of the specifications of all the devices by the total number of data.

Subsequently, the process capability calculating/judging unit 60 compares the calculated process capability A of the dangerous pattern Y with the process capability B desired in the production schedule supplied from the manufacturing apparatus deciding unit 20 (step S12). Here, in the present embodiment, the process capability A of the dangerous pattern Y corresponds to, for example, a second process capability.

When it is found as a result of the comparison that the process capability A is equal to or higher than the process capability B, there is no problem in terms of production, and the production can be continued. Thus, the process capability calculating/judging unit 60 generates various kinds of production commands and provides the production commands to the manufacturing apparatuses MU1 to MUN, respectively (step S13).

On the other hand, when it is found as a result of the comparison that the process capability A is lower than the process capability B, the process capability calculating/judging unit 60 informs the process capability improving unit 70 of this fact.

The layout data (design data) for the device X is input to the process capability improving unit 70 via the unshown I/O. The process capability improving unit 70 is also provided with information on the manufacturing apparatuses from the manufacturing apparatus deciding unit 20, information on the process condition from the process condition deciding/adjusting unit 30, and information on the dangerous pattern Y from the dangerous pattern identifying unit 50. Thus, the process capability improving unit 70 considers measures to improve the process capability A, analyses the result of the consideration, and then selects such a measure that causes the process capability A to be equal to or higher than the process capability B (step S14).

Specifically, the following measures can be listed as the measures to improve the process capability A.

(a) Change of process condition (step S15): In this case, a changed process condition is provided to the process condition deciding/adjusting unit 30, and the process flow returns to the point immediately before step S6.

(b) Change of layout data (step S16). More specifically, the layout of chips arranged in the design data is changed, and the shape of the dangerous pattern itself is changed. In this case, changed layout data is provided to the process condition deciding/adjusting unit 30, and the process flow returns to the point immediately before step S4.

(c) Reduction of the number of manufacturing apparatuses to be used (step S17). When the process capability improving unit 70 selects this measure, the kinds of manufacturing apparatuses to be reduced and the number of reductions are provided to the manufacturing apparatus deciding unit 20. The performance variation of the manufacturing apparatuses to be used is changed, so that the process flow returns to the point immediately before step S6, and the process condition is redecided and readjusted by the process condition deciding/adjusting unit 30.

(d) Narrowing of control width of the pattern Y (step S18). The control width of the pattern Y indicates the range of specifications which satisfies the range of specifications necessary for the semiconductor device X and which is needed in the production of the pattern Y. When this measure is selected, information on the control width to be narrowed is provided to the process capability calculating/judging unit 60, and the process flow returns to the point immediately before the calculation of the process capability A of the dangerous pattern Y in step S11.

Thus, even after the method of at least one of the measures (a) to (d) is selected by the process capability improving unit 70, the procedure described above is repeated until the process capability A of the dangerous pattern Y is equal to or higher than the process capability B desired in the production scheme.

Figure 3:
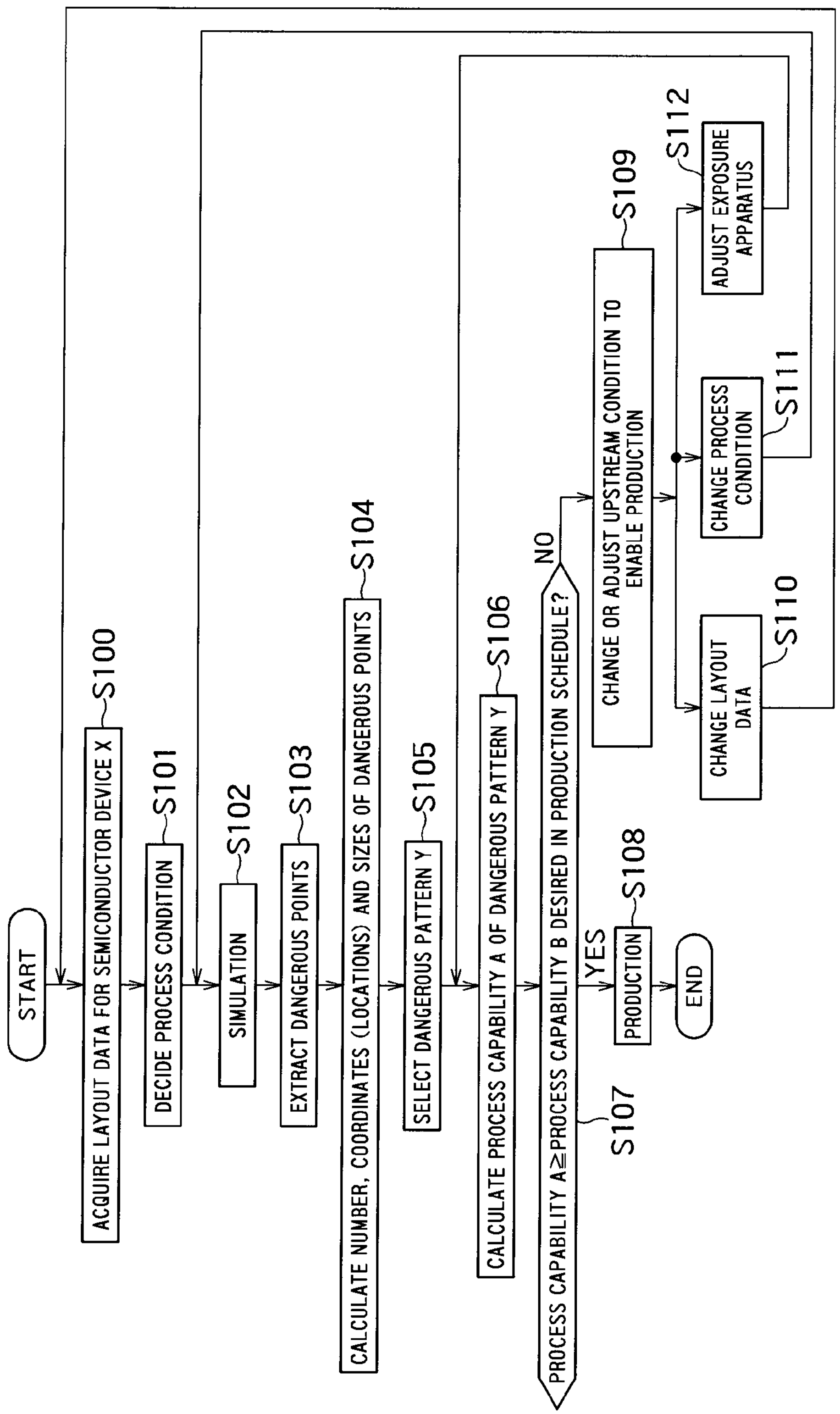
FIG. 3 is a flowchart showing the outline of a process control method according to a prior art.

FIG. 3 shows the schematic process of one example of a process control method according to a prior art. As apparent from the comparison with FIG. 2, the prior art does not take into account the fact that there are a plurality of semiconductor manufacturing apparatuses for mass production in extracting dangerous patterns.

According to the present embodiment, the dangerous pattern Y is extracted after the process condition has been adjusted in consideration of the performance variation among a plurality of manufacturing apparatuses. Further, the measure to improve the process capability A of the dangerous pattern Y is repeated until the process capability A is equal to or higher than the process capability B desired in the production scheme. Thus, robustness in production against the performance variation among the semiconductor manufacturing apparatuses is improved, and the semiconductor device X can be produced with a high mass production yield.

(ii) Second Embodiment

Figure 4:
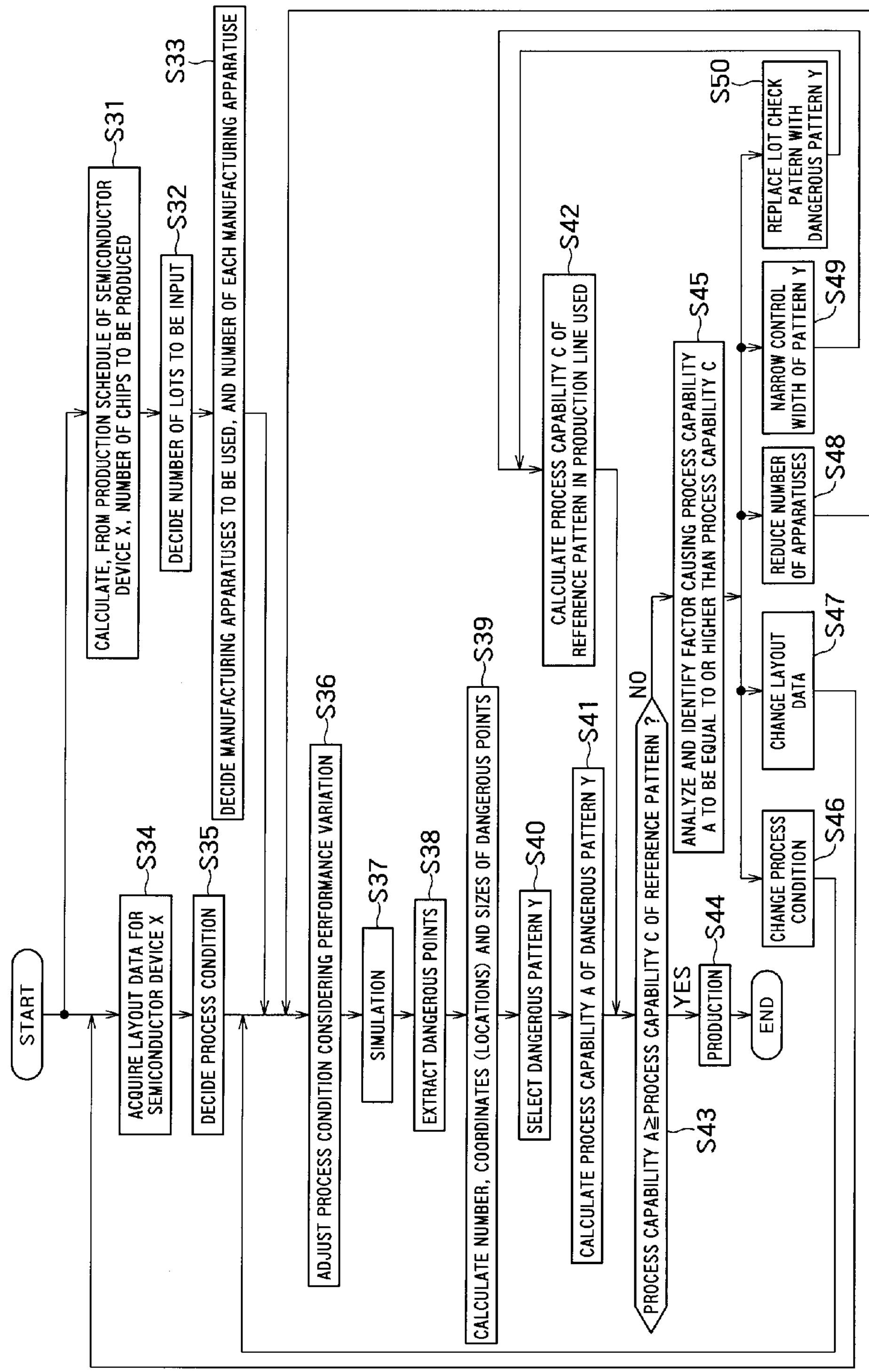
FIG. 4 is a flowchart showing the outline of a second embodiment of the process control method according to the present invention.

FIG. 4 shows the outline of a manufacturing process in a second embodiment of a process control method according to the present invention.

As apparent from the contrast with FIG. 2, the present embodiment is characterized in that there is further provided the step of calculating a process capability C of a reference pattern in a production line used (step S42), and in that the process capability of the dangerous pattern Y is compared with the process capability C of the reference pattern instead of the process capability B desired in the production schedule (step S43).

Here, the reference pattern in the production line used is a particular pattern present in the semiconductor device X, and serves to decide the production capability of the line for producing the semiconductor device X. Here, the production capability of the production line is calculated from, for example, the number of devices processed by the exposure apparatus per hour and the number of errors. The production capability of the production line, the reference pattern in the production line used, and the process capability C of the reference pattern are calculated and decided by, for example, the manufacturing apparatus deciding unit 20. In the present embodiment, the process capability C of the reference pattern corresponds to, for example, the first process capability.

As the measures to improve the process capability A, the present embodiment further includes a measure (e) to replace a lot check pattern with the dangerous pattern Y (step S50), in addition to the above-mentioned measures (a) to (d). Here, the lot check pattern means a pattern for judging whether the device specification of the semiconductor device X is satisfied in the production of the semiconductor device X in a production line.

The measure (e) causes the process capability improving unit 70 to replace a check pattern in a lot flowing in a process line for producing the semiconductor device X with the dangerous pattern Y. Consequently, the process capability A becomes equal to the process capability C, so that the production of the semiconductor device X is ensured. Other steps in the present embodiment are substantially the same as the steps shown in FIG. 2. Steps up to step S41 are the same as steps S1 to S11 in FIG. 2 to which a step number 30 is added, and steps S44, S46 to S49 are the same as the corresponding steps in FIG. 2 to which a step number 31 is added.

As described above, according to the present embodiment, at least one of the measures (a) to (e) is selected, and then the measure to improve the process capability A of the dangerous pattern Y is repeated until the process capability A is equal to or higher than the process capability C of the reference pattern, such that the semiconductor device X can be produced with a high mass production yield.

(3) Program and Recording Medium

A series of procedures of the process control method described above may be incorporated in a program, and read into and executed by the computer. This makes it possible to achieve the process control method according to the present invention by use of a general-purpose computer. Alternatively, the series of procedures of the process control method described above may be stored in a recording medium such as a flexible disk or a CD-ROM as a program to be executed by a computer, and read into and executed by the computer.

The recording medium is not limited to a portable medium such as a magnetic disk or an optical disk, and may be a fixed recording medium such as a hard disk drive or a memory. Further, the program incorporating the series of procedures of the process control method described above may be distributed via a communication line (including wireless communication) such as the Internet. Moreover, the program incorporating the series of procedures of the process control method described above may be distributed in an encrypted, modulated or compressed state via a wired line or a wireless line such as the Internet or in a manner stored in a recording medium.

(4) Semiconductor Device Manufacturing Method

When there are a plurality of semiconductor manufacturing apparatuses used to produce a semiconductor device, robustness in production against performance variation among the semiconductor manufacturing apparatuses is improved by using the above-described process control method to manufacture the semiconductor device. Thus, the semiconductor device can be manufactured with high throughput and yield.

While the embodiments of the present invention have been described above, it should be understood that the present invention is not at all limited to the embodiments described above, and various modifications can be made within the scope thereof.

What is claimed is:

1. A process controller comprising:

a manufacturing apparatus deciding unit which decides the number of lots to be input to a production line on the basis of a production schedule of a semiconductor device targeted for manufacture, calculates a first process capability serving as a judgment standard to find whether the production schedule is achieved, decides a plurality of manufacturing apparatuses used to manufacture the semiconductor device, and calculates the number of the decided manufacturing apparatuses from the number of input lots;

a process condition deciding/adjusting unit which prescribes a process condition of the manufacturing apparatuses from a design layout of the semiconductor device, and adjusts the process condition in consideration of a performance variation among the plurality of manufacturing apparatuses, the performance variation affecting a finished shape of a pattern used to manufacture the semiconductor device;

a simulator which runs a simulation of the finished shape under the adjusted process condition;

a dangerous pattern identifying unit which extracts a dangerous point affecting satisfaction of a required specification from the result of the simulation, and prescribes a pattern containing the extracted dangerous point as a dangerous pattern;

a process capability calculating/adjusting unit which calculates a second process capability different from the first process capability, the second process capability serving to form the prescribed dangerous pattern in the production line as a pattern having the desired shape, and compares the calculated second process capability with the first process capability, the process capability calculating/adjusting unit providing the calculated number of manufacturing apparatuses with a command to produce the semiconductor device under the adjusted process condition when the second process capability is equal to or higher than the first process capability; and a process capability improving unit which improves the second process capability when the calculated second process capability is lower than the first process capability.

2. The process controller according to claim 1, wherein the process capability improving unit improves the second process capability by at least one of a change in the design layout, a change in the process condition, a reduction in the number of manufacturing apparatuses, and a reduction in a control width of the dangerous pattern.

3. The process controller according to claim 1, wherein the process capability calculating/adjusting unit calculates the second process capability by use of a process capability index Cpk provided by the following equation:

$$Cpk=|\text{specification limit closer to average value}-\text{average value}|/3\sigma$$

where the average value means a value obtained by dividing the sum of specifications of all manufacture target devices by the total number of data, and $\sigma$ means a standard deviation.

4. The process controller according to claim 1, wherein the first process capability means a process capability desired to achieve the production schedule.

5. The process controller according to claim 1, wherein the manufacturing apparatus deciding unit selects a reference pattern in the production line, and calculates a process capability of the reference pattern as the first process capability, and the process capability improving unit improves the second process capability by at least one of a change in the design layout, a change in the process condition, a reduction in the number of manufacturing apparatuses, a reduction in a control width of the dangerous pattern, and replacement of a check pattern in the lot with the dangerous pattern.

6. A process control method comprising:

deciding the number of lots to be input to a production line on the basis of a production schedule of a semiconductor device targeted for manufacture;

calculating a first process capability serving as a judgment standard to find whether the production schedule is achieved;

deciding a plurality of manufacturing apparatuses used to manufacture the semiconductor device, and calculating the number of the decided manufacturing apparatuses from the number of input lots;

prescribing a process condition of the manufacturing apparatuses from a design layout of the semiconductor device;

adjusting the process condition in consideration of a performance variation among the plurality of manufacturing apparatuses, the performance variation affecting a finished shape of a pattern used to manufacture the semiconductor device;

running a simulation of the finished shape under the adjusted process condition;

extracting a dangerous point affecting satisfaction of a required specification from the result of the simulation;

prescribing a pattern containing the extracted dangerous point as a dangerous pattern;

calculating a second process capability serving to form the prescribed dangerous pattern in the production line as a pattern having the desired shape;

comparing the calculated second process capability with the first process capability;

using the calculated number of manufacturing apparatuses to produce the semiconductor device under the adjusted process condition when the second process capability is equal to or higher than the first process capability; and improving the second process capability when the second process capability is lower than the first process capability.

7. The process control method according to claim 6, wherein the second process capability is improved by at least one of a change in the design layout, a change in the process condition, a reduction in the number of manufacturing apparatuses, and a reduction in a control width of the dangerous pattern.

8. The process control method according to claim 6, wherein the second process capability is calculated by use of a process capability index Cpk provided by the following equation:

$$Cpk=|\text{specification limit closer to average value}-\text{average value}|/3\sigma$$

where the average value means a value obtained by dividing the sum of specifications of all manufacture target devices by the total number of data, and $\sigma$ means a standard deviation.

9. The process control method according to claim 6, wherein the first process capability means a process capability desired to achieve the production schedule.

10. The process control method according to claim 6, further comprising:

selecting a reference pattern in the production line, wherein the first process capability means a process capability of the reference pattern, and the second process capability is improved by at least one of a change in the design layout, a change in the process condition, a reduction in the number of manufacturing apparatuses, a reduction in a control width of the dangerous pattern, and replacement of a check pattern in the lot with the dangerous pattern.

11. A computer—readable recording medium containing a program to execute a computer a process control method, the process control method comprising:

deciding the number of lots to be input to a production line on the basis of a production schedule of a semiconductor device targeted for manufacture;

calculating a first process capability serving as a judgment standard to find whether the production schedule is achieved;

deciding a plurality of manufacturing apparatuses used to manufacture the semiconductor device, and calculating the number of the decided manufacturing apparatuses from the number of input lots;

calculating a second process capability serving to form a dangerous pattern in the production line as a pattern having the desired shape, the dangerous pattern containing a dangerous point that affects satisfaction of a required specification and is extracted from a finished shape obtained through a simulation from a design layout of the semiconductor device under a process condition that is adjusted in consideration of a performance variation among the plurality of manufacturing apparatuses.

12. The medium according to claim 11, wherein the process control method further comprises comparing the calculated second process capability with the first process capability;

using the calculated number of manufacturing apparatuses to produce the semiconductor device under the adjusted process condition when the second process capability is equal to or higher than the first process capability; and improving the second process capability when the second process capability is lower than the first process capability, and wherein the second process capability is improved by at least one of a change in the design layout, a change in the process condition, a reduction in the number of manufacturing apparatuses, and a reduction in a control width of the dangerous pattern.

13. The medium according to claim 11, wherein the second process capability is calculated by use of a process capability index Cpk provided by the following equation:

$$Cpk=|\text{specification limit closer to average value}-\text{average value}|/3\sigma$$

where the average value means a value obtained by dividing the sum of specifications of all manufacture target devices by the total number of data, and σ means a standard deviation.

14. The medium according to claim 11, wherein the first process capability means a process capability desired to achieve the production schedule.

15. The medium according to claim 11, wherein the process control method further comprises comparing the calculated second process capability with the first process capability;

using the calculated number of manufacturing apparatuses to produce the semiconductor device under the adjusted process condition when the second process capability is equal to or higher than the first process capability; and improving the second process capability when the second process capability is lower than the first process capability; and selecting a reference pattern in the production line, and wherein the first process capability means a process capability of the reference pattern, and the second process capability is improved by at least one of a change in the design layout, a change in the process condition, a reduction in the number of manufacturing apparatuses, a reduction in a control width of the dangerous pattern, and replacement of a check pattern in the lot with the dangerous pattern.

* * * * *